United States Patent [19]
Arima et al.

[11] Patent Number: 5,489,791
[45] Date of Patent: *Feb. 6, 1996

[54] FIELD EFFECT TRANSISTOR HAVING IMPURITY REGIONS OF DIFFERENT DEPTHS AND MANUFACTURING METHOD THEREOF

[75] Inventors: Hideaki Arima; Makoto Ohi; Natsuo Ajika; Atsushi Hachisuka; Tomonori Okudaira, all of Hyogo, Japan

[73] Assignee: Mitsubishi Denki Kabushiki Kaisha, Tokyo, Japan

[ * ] Notice: The term of this patent shall not extend beyond the expiration date of Pat. No. 5,276,344.

[21] Appl. No.: 100,950

[22] Filed: Aug. 3, 1993

Related U.S. Application Data

[63] Continuation of Ser. No. 13,500, Feb. 2, 1993, Pat. No. 5,276,344, which is a continuation of Ser. No. 683,379, Apr. 11, 1991, abandoned.

[30] Foreign Application Priority Data

Apr. 27, 1990 [JP] Japan .................................. 2-113634

[51] Int. Cl.$^6$ ........................ H01L 29/76; H01L 31/062; H01L 31/113; H01L 31/119
[52] U.S. Cl. ........................ 257/336; 257/306; 257/327; 257/344; 257/346
[58] Field of Search .................................. 257/335, 336, 257/337, 339, 306, 307, 308, 309, 311, 327, 344, 346, 534

[56] References Cited

U.S. PATENT DOCUMENTS

| | | | |
|---|---|---|---|
| 4,702,797 | 10/1987 | Shimano et al. | 156/653 |
| 4,978,628 | 12/1990 | Rosenthal | 437/44 |
| 5,005,072 | 4/1991 | Gonzalez | 357/23.6 |
| 5,108,940 | 4/1992 | Williams | 437/44 |

FOREIGN PATENT DOCUMENTS

| | | |
|---|---|---|
| 315422 | 5/1989 | European Pat. Off. . |
| 3922456 | 1/1990 | Germany . |
| 4107883 | 9/1991 | Germany . |
| 55-39688 | 3/1980 | Japan . |
| 60-37766 | 2/1985 | Japan . |
| 61-156862 | 7/1986 | Japan . |
| 62-114264 | 5/1987 | Japan . |
| 62-124765 | 6/1987 | Japan . |
| 0294472 | 9/1988 | Japan . |
| 63-318151 | 12/1988 | Japan . |
| 64-80066 | 3/1989 | Japan . |
| 1-80060 | 3/1989 | Japan . |

OTHER PUBLICATIONS

Wakamiya et al., "Novel Stacked Capacitor Cell for 64Mb DRAM", 1989 Symposium on VLSI Technology Digest of Technical Papers, pp. 69–70.
Kaga et al., "Crown–Type Stacked Capacitor Cell for 64 MDRAM Operative at 1.5V", The Second Proceeding of the 37th Joint Lecture Meeting on Applied Physics, 1990 p. 582.
Koyanagi et al, "Novel High Density, Stacked Capacitor MOS RAM", 1978 International Electron Devices Meeting Technical Digest, pp. 348–351.

*Primary Examiner*—Sara W. Crane
*Attorney, Agent, or Firm*—Lowe, Price, LeBlanc & Becker

[57] ABSTRACT

Disclosed is a semiconductor memory device in which defects in crystal in a junction region between a capacitor and a source/drain region, and a short channel effect of a transistor can be effectively reduced. The semiconductor memory device includes, on the side of a gate electrode at which the capacitor is connected, a sidewall formed to have a width larger than that of a sidewall on the side of a bit line, and a source/drain region to which the capacitor is connected and which is formed to have a diffusion depth larger than that of the opposite source/drain region. Therefore, the source/drain region effectively prevents defects in crystal from being produced in the junction region between the capacitor and the source/drain region connected to the capacitor and the sidewall effectively reduces the short channel effect.

3 Claims, 4 Drawing Sheets

FIELD EFFECT TRANSISTOR HAVING IMPURITY REGIONS OF DIFFERENT DEPTHS AND MANUFACTURING METHOD THEREOF

This application is a continuation of patent application Ser. No. 08/013,500 filed Feb. 2, 1993, now U.S. Pat. No. 5,276,344, which is a continuation of patent application Ser. No. 07/683,379, filed Apr. 11, 1991, now abandoned.

BACKGROUND OF THE INVENTION

1. Field of the Invention

The present invention relates generally to field effect transistors, and more particularly, to field effect transistors to be applied to a DRAM and a method of manufacturing the same.

2. Description of the Background Art

A DRAM using MOS transistors is known as a device for storing and writing information. FIG. 3 is a diagram showing a sectional arrangement of a memory cell of a conventional DRAM. With reference to FIG. 3, a thick field oxide film 2 for element isolation is formed on a surface of a p type silicon substrate 1. Furthermore, a transfer gate transistor 3 and a capacitor 10 are formed on the surface of p type silicon substrate between 1 field oxide films 2.

Transfer gate transistor 3 is provided with a gate electrode (word line) 4c formed on the surface of p type silicon substrate 1 with a gate oxide film 5 provided therebetween. Periphery of gate electrode 4c is covered with an isolation oxide film 44 at the both sides of gate electrode 4c. Sidewalls 44a having a sidewall structure are formed in isolation oxide film 44 at both sides of gate electrode 4c. $n^-$ impurity regions 43a, and 43b of low concentration are formed in p type silicon substrate 1 in a self-alignment manner with respect to gate electrode 4c. $n^+$ impurity regions 53a and 53b of high concentration are formed in a self-alignment manner with respect to sidewalls 44a. $n^-$ impurity regions 43a and 43b and $n^+$ impurity regions 53a and 53b constitute a generally called LDD (Lightly Doped Drain). Then, these impurity regions of the LDD structure serve as source/drain regions 6a and 6b. $n^-$ impurity regions 43a and 43b and $n^+$ impurity regions 53a and 53b are formed by ion implantation.

Capacitor 10 has a multilayer structure including an impurity doped lower electrode 11, a dielectric film 12 formed of a silicon nitride film or a silicon oxide film, or a multilayer film comprising a silicon nitride film and a silicon oxide film, and an upper electrode 13 formed of impurity doped polysilicon. Capacitor 10 has lower electrode 11 formed above gate electrode 4c of transfer gate transistor 3. In addition, a part of lower electrode 11 is connected to one source/drain 6a of transfer gate transistor 3. As described in the foregoing, capacitor 10 a part of which is formed above transfer gate transistor 3 is referred to as a stacked capacitor and a DRAM including such capacitor is referred to as stacked type DRAM. A bit line 15 is connected to source/drain region 6b. A gate electrode 4d is formed on field oxide film 2.

Writing to this memory cell is performed by applying, to gate electrode 4c, a voltage corresponding to a data signal applied to bit line 15 to turn on transfer gate transistor 3, thereby storing charges corresponding to the data applied to bit line 15 in capacitor 10. Conversely, for reading the charges corresponding to the data stored in capacitor 10, a predetermined voltage is applied to gate electrode 4c to turn on transfer gate transistor 3, thereby reading the voltage corresponding to the charges stored in capacitor 10 from bit line 15.

As described above, a memory cell of a conventional DRAM comprises source/drain region 6b connected to bit line 15 and source/drain region 6a connected to capacitor 10 both formed by ion implantation.

However, with this ion implantation method, ion implantation to the surface of p type silicon substrate 1 causes imperfection in crystal on the surface of the substrate. Imperfection in crystal is also caused by etching at the time of forming sidewall 44a or impurity doping to lower electrode 11. The defective in crystal on the substrate surface allows the electric charges stored in capacitor 10 to leak in p type silicon substrate 1, which results in deterioration of a refresh characteristic of the DRAM. On the other hand, source/drain region 6b connected to bit line 15 is not so largely affected by the defective crystal on the surface because the region receives an external power supply through bit line 15.

Therefore, conventionally proposed is a method of forming source/drain region 6a connected to lower electrode 11 of capacitor 10 not by ion implantation but by thermal diffusion, which method is disclosed in Japanese Patent Laying-Open No. 64-80066, for example. FIG. 4 is a diagram showing a sectional arrangement of source/drain regions formed by thermal diffusion and connected to a capacitor shown in FIG. 3 for explaining diffusion thereof. With reference to FIG. 4, $n^-$ impurity region 43a is formed by ion implantation like a conventional one because the region is scarcely damaged by ion implantation. Thereafter, impurity doped lower electrode 11 is subjected to a heat treatment to diffuse the impurities included therein into p type silicon substrate 1. This method of forming source/drain region 6a by thermal diffusion, however, requires source/drain regions of a large depth in order to keep the defective crystal in source/drain region 6a. In this thermal diffusion method, as the depth of source/drain region 6a becomes larger, the lateral diffusion is enhanced to reach the underside of gate electrode 4c. In such a case, the effective channel length of transfer gate transistor 3 is reduced to enhance a generally called short channel effect. One way of avoiding these problems is making sidewall 44a at the opposite sides of gate electrode 4c uniformly thicker. However, $n^-$ impurity region 43b constituting the LDD structure serves to weaken the field strength of the pn junction, thereby suppressing generation of hot carriers, so that its diffusion width and impurity concentration should be precisely controlled. Therefore, the width of sidewall 44a which is a factor of controlling the diffusion width of $n^-$ impurity region 43b in a self-alignment manner should be also controlled precisely. As a result, it is not possible to increase the width of sidewall 44a without considering other factors. In other words, conventionally a thermal diffusion method utilized in order to reduce defective crystal on a substrate surface results in an increase of a short channel effect. It is therefore difficult to reduce the defective crystal on the substrate surface while effectively preventing the short channel effect.

SUMMARY OF THE INVENTION

One object of the present invention is to effectively prevent a short channel effect in a field effect transistor while effectively reducing defective crystal on a substrate surface.

Another object of the present invention is to improve transistor characteristics of a field effect transistor.

A further object of the present invention is to effectively prevent leakage of electric charges stored in a capacitor of a field effect transistor when used in a memory cell of a DRAM.

Still further object of the present invention is to prevent impurities from diffusing to a region under a gate electrode when in forming an impurity region connected to a capacitor used in a memory cell of a DRAM in a manufacturing method of a field effect transistor.

According to one aspect of the present invention, in a field effect transistor, a first impurity region having one end connected to one end of a channel region is formed at a surface of a semiconductor substrate. A second impurity region having one end connected to the other end of the channel region and a maximum depth larger than a maximum depth of the first impurity region is formed at the surface of the semiconductor substrate. A gate electrode is formed on the channel region of the semiconductor substrate with a gate insulation film provided therebetween. A first sidewall insulation film is formed at the sidewall of the gate electrode on the first impurity region side. A first conductive layer supplied with a predetermined potential is in contact with the side surface of the first sidewall insulation film and electrically connected to the first impurity region. A second sidewall insulation film having a width larger than that of the first sidewall insulation film is formed at the sidewall of the gate electrode on the second impurity region side. A second conductive layer is in contact with the side surface of the second sidewall insulation film and electrically connected to the second impurity region.

In operation, the second impurity region having one end being in contact with the other end of the channel region and its maximum depth larger than that of the first impurity region is formed at the surface of the semiconductor substrate, the second sidewall insulation film larger in width than the first sidewall insulation film is formed at the sidewall of the gate electrode on the second impurity region side and the second conductive layer is formed to be in contact with the side surface of the second sidewall insulation film and electrically connected to the second impurity region, whereby defective crystal produced in a contact region between the second conductive layer and the second impurity region is effectively covered with the second impurity region.

According to another aspect of the present invention, in the method of manufacturing a field effect element, a gate electrode is formed on a semiconductor substrate with an insulation film provided therebetween. A first insulation film is formed on the semiconductor substrate and the gate electrode and is etched to obtain a first sidewall insulation film formed at the sidewall portion of the gate electrode. A first impurity region is formed by ion implantation of impurities by using the first sidewall insulation film as a mask. A first conductive layer and a second insulation film are formed on the first impurity region and the first sidewall insulation film and patterned into a predetermined configuration. A third insulation film is formed all over the semiconductor substrate and the film is anisotropically etched to form a second sidewall insulation film at the sidewall portion of the first conductive layer and at the sidewall portion of the first sidewall insulation film. An impurity doped second conductive layer is formed on the second sidewall insulation film and on the semiconductor substrate on the side at which the second sidewall insulation film of the gate electrode is formed. A second impurity region is formed by diffusing the impurities introduced in the second conductive layer into the semiconductor substrate by heat treatment.

In operation, the gate electrode is formed on the semiconductor substrate with the insulation film provided therebetween. The first insulation film is formed on the semiconductor substrate and the gate electrode and etched to form the first sidewall insulation film at the sidewall portion of the gate electrode, the first impurity region is formed by ion implantation of impurities by using the first sidewall insulation film as a mask, the first conductive layer and the second insulation film are formed on the first impurity region and the first sidewall insulation film and patterned into a predetermined configuration, the third insulation film is formed all over the semiconductor substrate and anisotropically etched to form the second sidewall insulation film at the sidewall of the first conductive layer and at the sidewall portion of the first sidewall insulation film, the impurity doped second conductive layer is formed on the second sidewall insulation film and on the semiconductor substrate on the side the second sidewall insulation film of the gate electrode is formed, and the second impurity region is formed by diffusing the impurities introduced in the second conductive layer into the semiconductor substrate by heat treatment, whereby the second sidewall insulation film suppresses the impurities introduced in the second conductive layer from laterally diffusing to the underside of the gate electrode.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

An embodiment of the present invention will be described in detail in the following with reference to the drawings.

Figure 1:
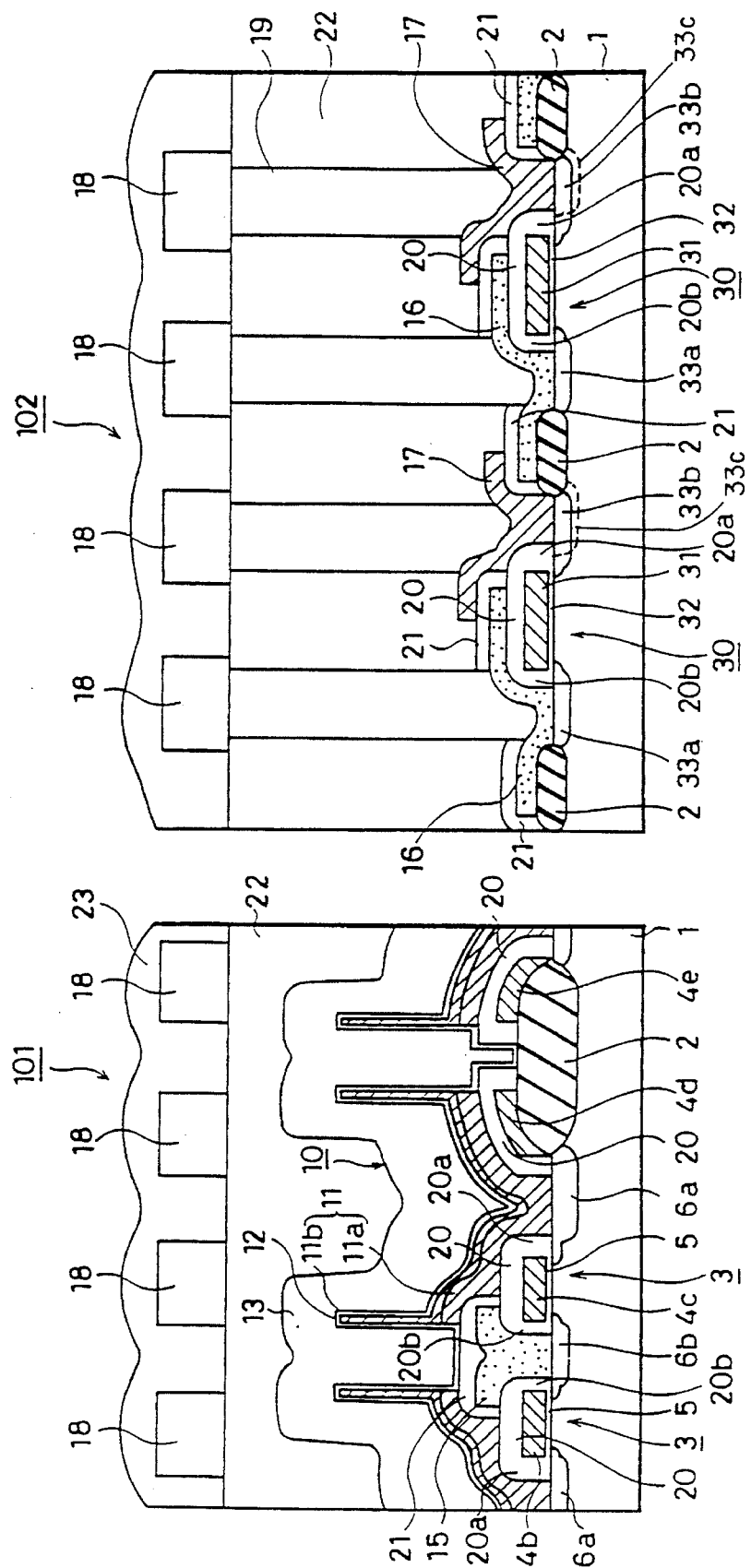
FIG. 1 is a diagram of a sectional arrangement of a DRAM according to one embodiment of the present invention.

With reference to FIG. 1, the DRAM comprises a memory cell array 101 and a peripheral circuit 102. Memory cell array 101 includes a transfer gate transistor 3 and a capacitor 10. Transfer gate transistor 3 includes a pair of source/drain regions 6a and 6b formed on a surface of a p type silicon substrate 1 and gate electrodes 4b and 4c formed on the surface of p type silicon substrate 1 sandwiched between source/drain regions 6a and 6b, with a gate insulation film 5 provided therebetween. Each of gate electrodes 4b and 4c is covered with an insulation oxide film 20 and sidewalls 20a and 20b. Capacitor 10 has a multilayer structure including a lower electrode (storage node) 11, a dielectric layer 12 and an upper electrode (cell plate) 13. Lower electrode 11 comprises a base portion 11a connected to source/drain region 6a formed adjacent to a field oxide film 2, and a standing wall portion 11b formed along an outermost periphery of base portion 11a in a vertical direction. Standing wall portion 11b of lower electrode 11 is effective for ensuring a fixed capacitance when the memory cell array 101 is made small in scale because both of the inner and outer side surfaces of standing wall portion 11b constitute capacitances. A bit line 15 is connected to one source/drain region 6b of transfer gate transistor 3. Formed on field oxide film 2 are gate electrodes 4d and 4e covered with an insulation oxide film 20. Formed on upper electrode 13 is an interlayer insulation layer 22 on which wiring layers 18 are formed corresponding to gate electrodes 4b, 4c, 4d and 4e, respectively. A protection film 23 is formed covering wiring layers 18.

Peripheral circuit 102 comprises MOS transistors 30 of the same conductivity type. More specifically, source/drain regions 33a and 33b corresponding to each of MOS transistors 30 are formed on p type silicon substrate 1 and these MOS transistors are isolated from each other by field oxide films 2. A wiring layer 16 is connected to source/drain region 33a and a wiring layer 17 is formed on source/drain region 33b. Wiring layers 18 are formed above wiring layers 16 and 17, with contact plugs 19 provided therebetween. A gate electrode 31 is formed on the substrate sandwiched between one pair of source/drain regions 33a and 33b, with a gate oxide film 32 provided therebetween. Insulation oxide film 20 and sidewalls 20a and 20b are formed covering gate electrode 31. Insulation oxide film 21 is interposed in a region at which wiring layers 16 and 17 are overlapped with each other.

The DRAM according to the present embodiment is structured as described above and it is distinct from a conventional structure because of sidewall 20a and source/drain region 6a. That is, the width of sidewall 20a is made larger than that of sidewall 20b to which bit line 15 is connected and source/drain region 6a is formed larger in depth than source/drain region 6b. With such arrangement, it is possible to keep, in source/region 6a, defective crystal produced in a junction region between lower electrode 11 of capacitor 10 and source/drain region 6a to reduce an adverse effect produced by the defective crystal.

Figure 2A:
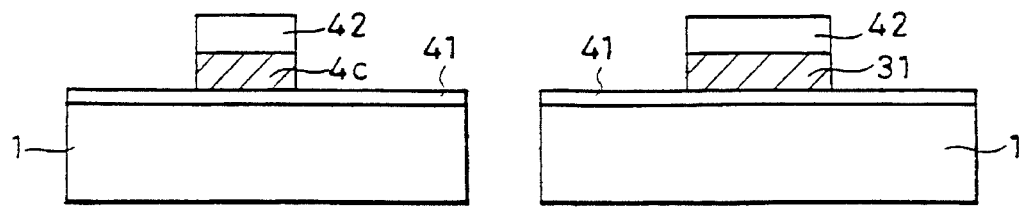
FIGS. 2A to 2H are diagrams of a sectional arrangement explaining manufacturing processes of a transfer gate transistor of the memory cell array and a MOS transistor in the peripheral circuit shown in FIG. 1.
Figure 2B:
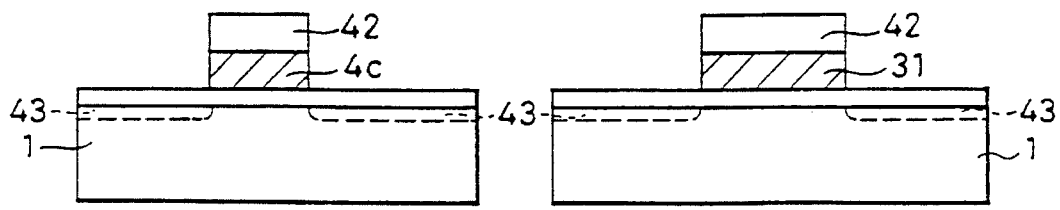
Figure 2C:
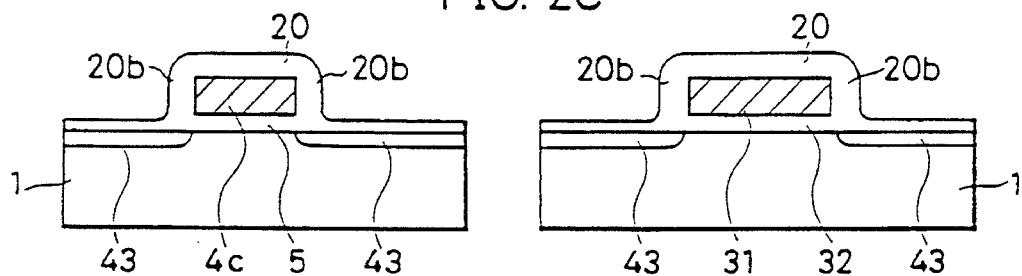
Figure 2D:
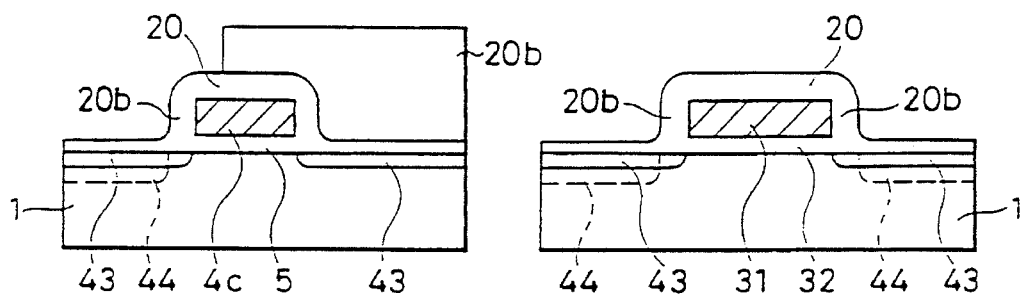
Figure 2E:
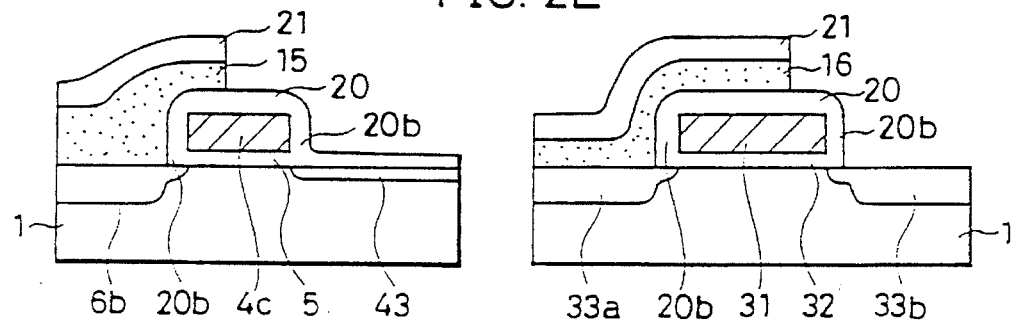
Figure 2F:
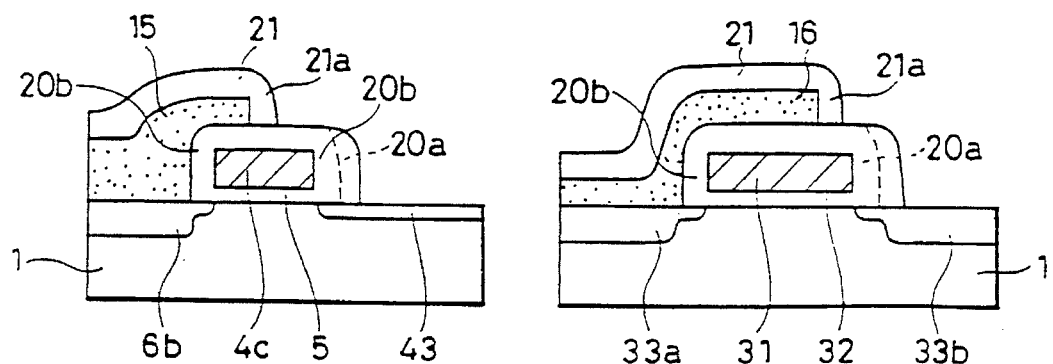
Figure 2G:
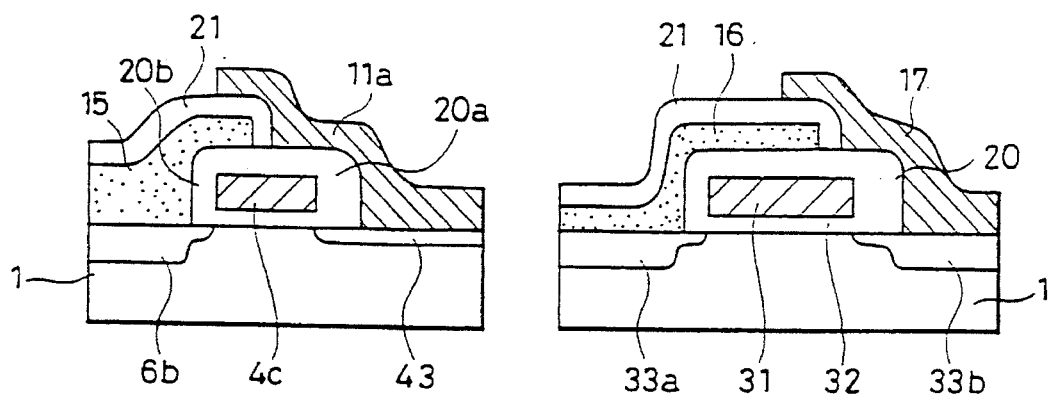
Figure 2H:
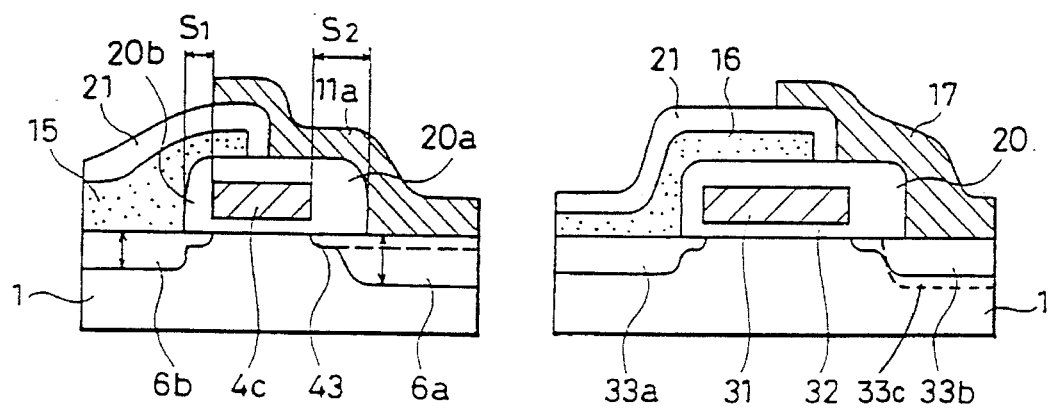
Figure 3:
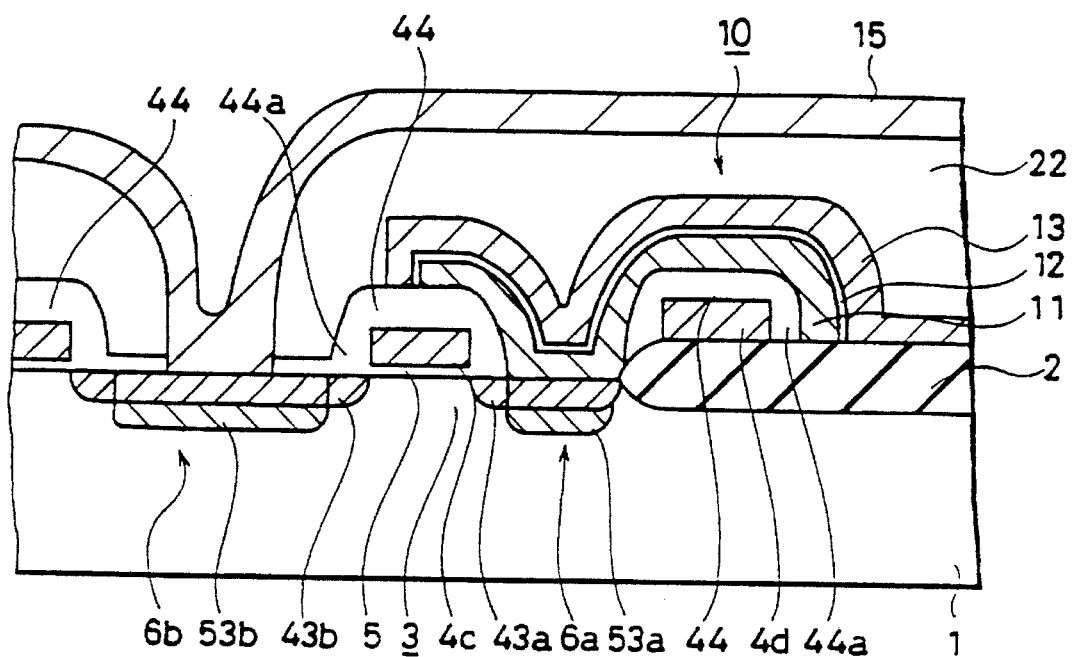
FIG. 3 is a diagram of a sectional arrangement of a memory cell of a conventional DRAM.
Figure 4:
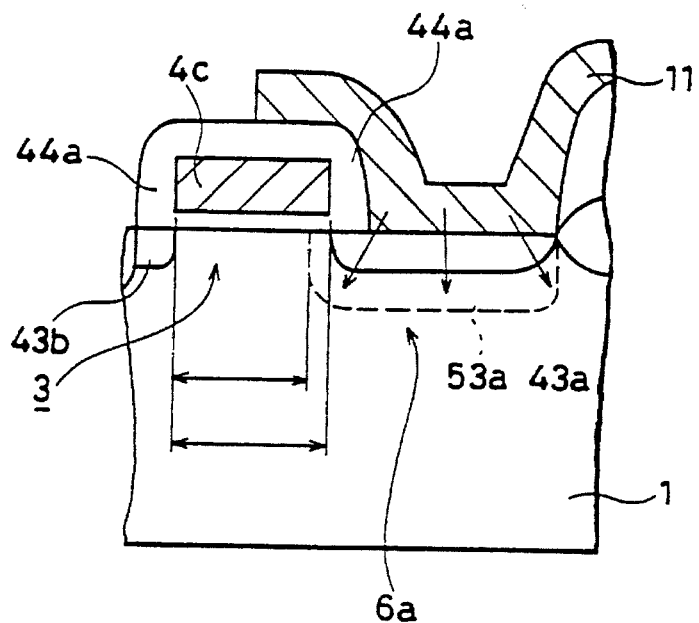
FIG. 4 is a diagram of a sectional arrangement explaining a diffusion state when the source/drain regions connected to the capacitor shown in FIG. 3 are formed by thermal diffusion.

The manufacturing processes will be described with reference to FIGS. 2A to 2H. First, as shown in FIG. 2A, an oxide film 41 of $SiO_2$ is formed on p type silicon substrate 1. Polysilicon layers serving as gate electrodes 4c and 31 are formed on oxide film 41 to obtain oxide films 42 of $SiO_2$. As shown in FIG. 2B, an n$^-$ impurity regions 43 having a concentration of $1 \times 10^{13}$ –$3 \times 10^{14}/cm^2$, for example, are formed by ion implantation of As (arsenic) or P (phosphorus). As shown in FIG. 2C, an oxide film of $SiO_2$ is formed all over and anisotropically etched to form sidewalls 20b and insulation oxide films 20. As shown in FIG. 2D, a resist 45 is formed over n$^-$ impurity region 43 to which a capacitor of the memory cell which will be described later is connected and over gate electrode 4c. As ions are implanted by using resist 45 as a mask to form an n$^+$ impurity region 44 having an impurity concentration of $1 \times 10^{15}$–$6 \times 10^{16}/cm^2$ for example. As shown in FIG. 2E, the above-described n$^-$ impurity regions 43 and n$^+$ impurity regions 44 constitute source/drain regions 6b, 33a and 33b. The oxide films formed on source/drain regions 6b, 33a and 33b is removed by RIE. Insulation oxide film 21 formed of a polysilicon layer and $SiO_2$ is formed all over and patterned into a predetermined configuration to obtain bit line 15 and insulation oxide film 21 over source/drain region 6b and wiring layer 16 and insulation oxide film 21 over source/drain region 33a. As ions have been implanted in bit line 15 and wiring layer 16. Then, as shown in FIG. 2F, an oxide film of $SiO_2$ is formed all over and then anisotropically etched to form sidewalls 21a and 20a at the sidewall of bit line 15 and wiring layer 16, and at the sidewall portions of gate electrodes 4c and 31, respectively. As a result, the sidewalls 20a and 20b at the opposite sidewall portions of each of gate electrodes 4c and 31 are configured such that sidewall 20a is larger in width than sidewall 20b. Thereafter, as shown in FIG. 2G, base portion 11a and wiring layer 17 constituting the lower electrode of the capacitor formed by implanting P (phosphorus) in the polysilicon layer are formed on n$^-$ impurity region 43 and source/drain region 33b, respectively. Then, as shown in FIG. 2H, the P (phosphorus) injected in base portion 11a and wiring layer 17 is diffused, by thermal diffusion, into n$^-$ impurity region 43 and 33c (see FIG. 2G) connected to base portion 11a and wiring layer 17, respectively. This thermal diffusion is carried out, for example, at 850° C. within five hours. As a result, source/drain region 6a is formed. Comparing sidewalls 20a and 20b formed according to the present embodiment, 20a is formed to have a width $S_1$ of 1000Å and 20b is formed to have a width $S_2$ of 1500–2000Å, for example. As described in the foregoing, even if a thermal diffusion depth of the phosphorus injected in base portion 11a is large, sidewall 20a of the increased width prevents the diffusion from extending beyond n$^-$ impurity region 43 and avoids formation of source/drain region 6a under gate electrode 4c. Therefore, the problematic short channel effect can be effectively prevented that an effective channel length is reduced in a case where source/drain region 6a connected to base portion 11a constituting a lower electrode of a capacitor is formed to have a large depth by thermal diffusion. As a result, it is possible to effectively avoid the short channel effect while effectively preventing imperfection to be caused in crystal in a junction region between the capacitor and the impurity region to which the capacitor is connected, which has been conventionally difficult to achieve. Source/drain region 6a is formed to have a diffusion depth $x_2$ of 1500–2000Å, for example, and source/drain region 6b is formed to have a diffusion depth of 1000Å, for example. While both source/drain regions 6a and 6b have the LDD structure according to the present embodiment, the present invention is not limited thereto and only source/drain region 6a can have the LDD structure. As described above, after the formation of the sidewall and the thermal diffusion layer, the DRAM shown in FIG. 1 is formed through several processes. In the DRAM according to the present embodiment, by making the thickness of sidewall 20a large and forming source/drain region 6a connected to capacitor 10 to have a large depth by thermal diffusion, defects in crystal in the junction region between capacitor 10 and source/drain region 6a can be effectively reduced and the short channel effect of transfer gate transistor 3 can be also effectively prevented. As a result, it is possible to effectively prevent leakage of the electric charges stored in capacitor 10 to improve the refresh characteristic and transistor characteristics of transfer gate transistor 3.

As described in the foregoing, in the field effect element according to the present invention wherein a first impurity region having one end in contact with one end of a channel region and a second impurity region having one end in contact with the other end of the channel region and having its maximum depth larger than that of the first impurity region are formed at the surface of the semiconductor substrate, a gate electrode is formed on the channel region of the semiconductor substrate with a gate insulation film provided therebetween, a first sidewall insulation film is formed at the sidewall of the gate electrode on the first impurity region side, a first conductive layer supplied with a predetermined potential is formed to be in contact with the side surface of the first sidewall insulation film and to be electrically connected to the first impurity region, a second sidewall insulation film having a width larger than that of the first sidewall insulation film is formed at the sidewall of the gate electrode on the second impurity region side and a second conductive layer is formed to be in contact with the side surface of the second sidewall insulation film and to be electrically connected to the second impurity region, defects produced in crystal in the junction region between the second conductive layer and the second impurity region are effectively covered with the second impurity region, thereby effectively reducing the defects in crystal of the substrate surface.

According to the method of manufacturing the field effect element of the present invention including the steps of forming a gate electrode on a semiconductor substrate with an insulation film provided therebetween, forming a first insulation film on the semiconductor substrate and the gate electrode and etching the same to form a first sidewall insulation film at the sidewall portion of the gate electrode, implanting impurity ions by using the first sidewall insulation film as a mask to form a first impurity region, forming a first conductive layer and a second insulation film over the first impurity region and the first sidewall insulation film and patterning the same into a predetermined configuration, forming a third insulation film all over the semiconductor substrate and etching the same to form a second sidewall insulation film at the sidewall portion of the first conductive layer and at the sidewall portion of the first sidewall insulation film, forming an impurity injected second conductive layer on the second sidewall insulation film and on the semiconductor substrate on the side of the second sidewall insulation film of the gate electrode is formed and diffusing the impurities injected in the second conductive layer into the semiconductor substrate by thermal treatment to form a second impurity region, the second sidewall insulation film presents the impurities injected in the second conductive layer from laterally diffusing to the underside of the gate electrode, thereby effectively preventing a short channel effect.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device including a memory cell array region and a peripheral circuit region, each of said memory cell array region and said peripheral circuit region having a field effect transistor, said memory cell array region comprising:
a first impurity region of an impurity type formed at a surface of a semiconductor substrate including
a first region of low concentration having first and second lateral ends in a channel length direction and a first depth in said semiconductor substrate, said first lateral end being in contact with one end of a first channel region, and
a second region of high concentration having a third lateral end in said channel length direction, a second depth in said semiconductor substrate, larger than said first depth, and a bottom surface parallel to said semiconductor substrate, the second lateral end of said first region being in contact with said third lateral end,
a second impurity region of said impurity type formed at the surface of said semiconductor substrate including
a third region of low concentration having fourth and fifth lateral ends in said channel length direction and said first depth in said semiconductor substrate, said fourth lateral end being in contact with the other end of the first channel region, and
a fourth region of high concentration having a sixth lateral end in said channel length direction, a third depth in said semiconductor substrate, larger than said second depth, and a bottom surface parallel to said semiconductor substrate in common contact with said sixth lateral end, the fourth lateral end of said first region being formed in contact also with said sixth lateral end,
a first gate electrode formed on said first channel region of said semiconductor substrate with a first gate insulation film provided therebetween,
a first sidewall insulation film formed at the sidewall of said first gate electrode on said first impurity region side,
a first conductive layer in contact with the side surface of said first sidewall insulation film and electrically connected to said first source/drain region,
a second sidewall insulation film formed at the sidewall of said first gate electrode on said second impurity region side and having a width in said channel length direction, larger than that of said first sidewall insulation film and sufficient to prevent a short-channel effect caused extension of the second impurity region under the first gate electrode, an end of said second sidewall insulation film in said channel length direction substantially forming a plane normal to said semiconductor substrate and said common contact between said bottom surface of said fourth region of high concentration and said sixth lateral end substantially coinciding with said plane, and
a second conductive layer being in contact with the side surface of said second sidewall insulation film and electrically connected to said second impurity region; and said peripheral circuit region comprising:
a third impurity region of said impurity type formed at the surface of said semiconductor substrate and having one end in contact with one end of a second channel region,
a fourth impurity region formed on the surface of said semiconductor substrate and having one end in contact with the other end of said second channel region, a maximum depth of said fourth impurity region in said semiconductor substrate being larger than that of said third impurity region,
a second gate electrode formed on the second channel region of said semiconductor substrate with a second gate insulation film provided therebetween,
a third sidewall insulation film formed at the sidewall of said second gate electrode on said third impurity region side,
a third conductive layer supplied with a predetermined potential, and being in contact with the side surface of said third sidewall insulation film and electrically connected to said third impurity region,
a fourth sidewall insulation film formed at the sidewall of said second gate electrode on said fourth impurity region side and having a width larger than that of said third sidewall insulation film in the direction along the main surface of said semiconductor substrate, and a fourth conductive layer being in contact with the side surface of said fourth sidewall insulation film and electrically connected to said fourth impurity region.

2. The semiconductor device according to claim 1, wherein said second conductive layer is a capacitor lower electrode.

3. The semiconductor device according to claim 1, wherein said first conductive layer is a bit line, said first gate electrode is a word line, and said second conductive layer is a capacitor lower electrode.

* * * * *